US012665172B2

(12) United States Patent
Nagarajan et al.

(10) Patent No.: US 12,665,172 B2
(45) Date of Patent: Jun. 23, 2026

(54) GAS COOLED HIGH POWER CONNECTION ROD

(71) Applicant: Applied Materials, Inc., Santa Clara, CA (US)

(72) Inventors: Kumaresan Nagarajan, Bengaluru (IN); Yue Guo, Redwood City, CA (US); Vijay Singh, Bangalore (IN); Adarsh Balareddy, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 647 days.

(21) Appl. No.: 17/896,075

(22) Filed: Aug. 26, 2022

(65) Prior Publication Data

US 2024/0071729 A1      Feb. 29, 2024

(51) Int. Cl.
H01J 37/32          (2006.01)
H01B 5/00          (2006.01)
(Continued)

(52) U.S. Cl.
CPC .......... H01J 37/32577 (2013.01); H01B 5/00 (2013.01); H01J 37/32082 (2013.01); (Continued)

(58) Field of Classification Search
CPC .......... H01J 37/32577; H01J 37/32082; H01J 2237/334; H01B 5/00; H01R 4/4881; H01R 4/60
See application file for complete search history.

(56) References Cited

U.S. PATENT DOCUMENTS 3,886,301 A      5/1975   Cronin et al.
5,798,904 A      8/1998   Guyot
(Continued)

FOREIGN PATENT DOCUMENTS

JP      2003282544 A      10/2003
JP      2009266418 A      11/2009
KR      20140087149 A       7/2014

OTHER PUBLICATIONS

PCT International Search Report and Written Opinion for PCT/US2023/030879 dated Dec. 15, 2023.

*Primary Examiner* — Yuechuan Yu
(74) *Attorney, Agent, or Firm* — Moser Taboada

(57) ABSTRACT

Embodiments of radio frequency (RF) power connection rods are provided herein. In some embodiments, an RF power connection rod includes a first connection rod having a first connection end, a first socket end opposite the first connection end, and a first hollow portion extending from the first connection end to the first socket end; a second connection rod having a second connection end, a second socket end opposite the second connection end, and a second hollow portion extending from the second connection end to the second socket end, wherein the second connection end is adjustably coupled to the first connection end along an axial direction of the second connection rod, and wherein a gas flow path extends from one or more gas inlets of the first connection rod, through the first hollow portion to the second hollow portion, to one or more gas outlets disposed through the second connection rod; a first plug coupled to the first socket end; and a second plug coupled to the second socket end.

20 Claims, 3 Drawing Sheets

(51) Int. Cl.
    *H01R 4/48*          (2006.01)
    *H01R 4/60*          (2006.01)
(52) U.S. Cl.
    CPC ....... *H01J 2237/334* (2013.01); *H01R 4/4881*
                    (2013.01); *H01R 4/60* (2013.01)

(56)                References Cited

U.S. PATENT DOCUMENTS

| | | |
|---|---|---|
| 6,151,203 A | 11/2000 | Shamouilian et al. |
| 8,070,925 B2 | 12/2011 | Hoffman et al. |
| 2012/0192791 A1 | 8/2012 | Hillabrand et al. |
| 2013/0143430 A1* | 6/2013 | Sorolla Rosario ....... H01R 9/05 439/485 |
| 2013/0284369 A1* | 10/2013 | Kobayashi ........ H01J 37/32091 118/712 |
| 2018/0308669 A1 | 10/2018 | Bokka et al. |
| 2018/0350610 A1 | 12/2018 | Lingampalli et al. |
| 2020/0013586 A1 | 1/2020 | Ma et al. |
| 2020/0388998 A1* | 12/2020 | Kraus ................... H01B 1/026 |
| 2021/0398782 A1 | 12/2021 | Saito et al. |

* cited by examiner

GAS COOLED HIGH POWER CONNECTION ROD

FIELD

Embodiments of the present disclosure generally relate to substrate processing equipment, and more specifically, to power connection rods for substrate processing equipment.

BACKGROUND

Power connectors are used in substrate processing equipment, for example, to couple power from a radio frequency (RF) power source to a process chamber. The substrate processing equipment may include an RF match that transforms a complex circuit impedance of an RF power source to the required impedance and supplies RF energy from the RF power source to the process chamber via a power connector. The high power can create arcing between parts due to a high voltage difference, which may lead to a safety hazard incident. Conventional power connectors consist of copper straps to supply high power. However, copper straps have sharp edges which can lead to arcing.

Accordingly, the inventors have provided embodiments of improved power connectors for use in substrate processing equipment.

SUMMARY

Embodiments of power connectors comprising radio frequency (RF) power connection rods are provided herein. In some embodiments, an RF power connection rod includes a first connection rod having a first connection end, a first socket end opposite the first connection end, and a first hollow portion extending from the first connection end to the first socket end; a second connection rod having a second connection end, a second socket end opposite the second connection end, and a second hollow portion extending from the second connection end to the second socket end, wherein the second connection end is adjustably coupled to the first connection end along an axial direction of the second connection rod, and wherein a gas flow path extends from one or more gas inlets of the first connection rod, through the first hollow portion to the second hollow portion, to one or more gas outlets disposed through the second connection rod; a first plug coupled to the first socket end; and a second plug coupled to the second socket end.

In some embodiments, a radio frequency (RF) power connection rod for use with a process chamber includes: a first connection rod having a first connection end, a first socket end opposite the first connection end, and a first hollow portion extending from the first connection end to the first socket end; a second connection rod having a second connection end, a second socket end opposite the second connection end, and a second hollow portion extending from the second connection end to the second socket end, wherein the second connection end is adjustably coupled to the first connection end along an axial direction of the second connection rod; a first plug rotatably coupled to the first socket end via an opening in the first socket end; and a second plug rotatably coupled to the second socket end via a second opening in the second socket end.

In some embodiments, a process chamber includes: a chamber body having an interior volume therein; a substrate support disposed in the interior volume; an RF power supply coupled to the chamber body; and an RF power connection rod coupled to the RF power supply to provide RF power to the substrate support, the RF power connection rod, comprising: a first connection rod having a first connection end, a first socket end opposite the first connection end, and a first hollow portion extending from the first connection end to the first socket end; a second connection rod having a second connection end, a second socket end opposite the second connection end, and a second hollow portion extending from the second connection end to the second socket end, wherein the second connection end is adjustably coupled to the first connection end along an axial direction of the second connection rod, and wherein a gas flow path extends from one or more gas inlets of the first connection rod, through the first hollow portion to the second hollow portion, to one or more gas outlets disposed through the second connection rod; a first plug rotatably coupled to the first socket end; and a second plug rotatably coupled to the second socket end.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
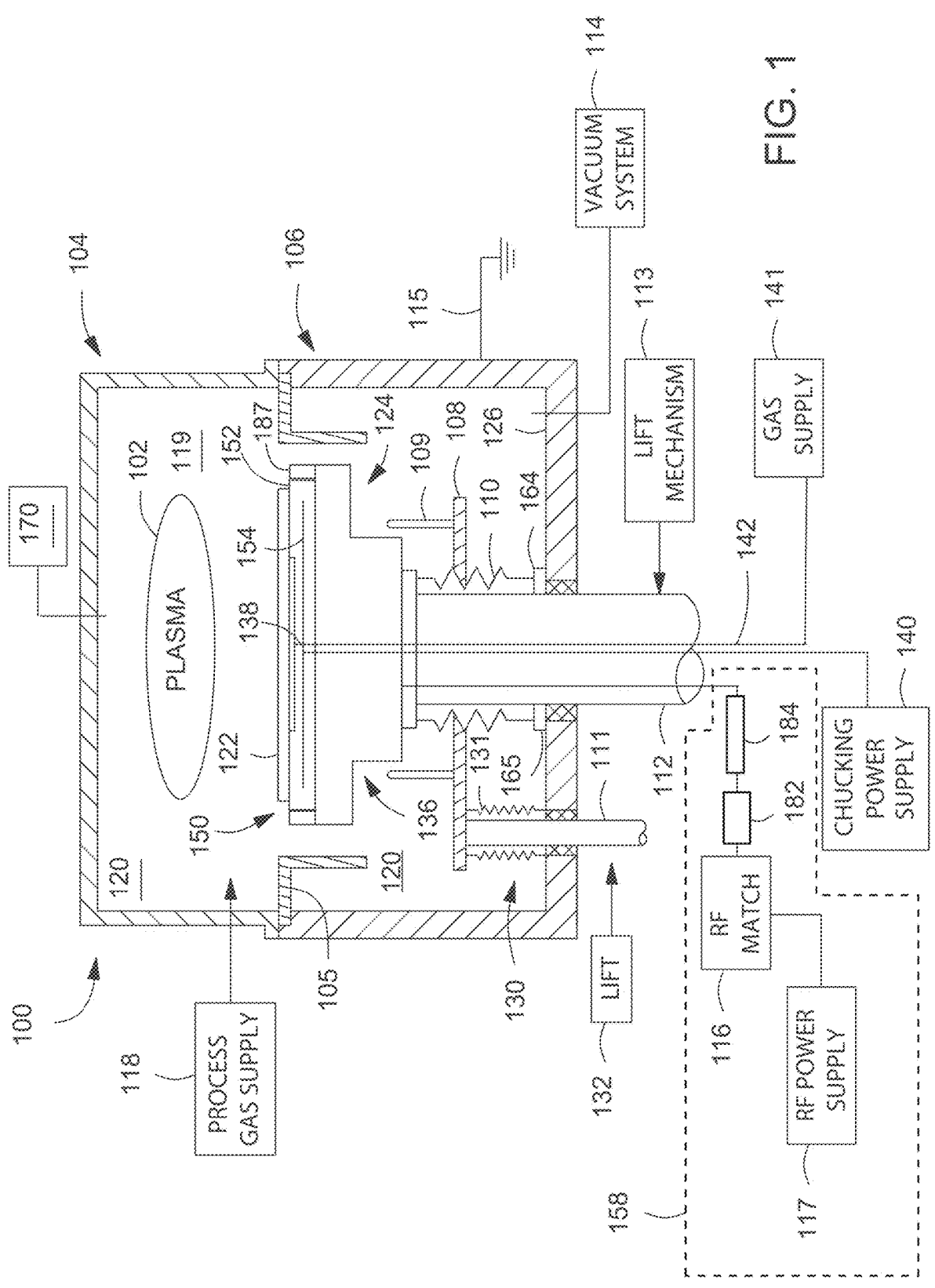
FIG. 1 depicts a schematic view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of power connectors comprising radio frequency (RF) power connection rods are provided herein. The RF power connection rods generally comprise a connection rod designed to connect an output sensor of an RF supply to a process chamber using coaxial connecting hollow rods which allow transmission of high power and current without variation to the output and arcing. The RF power connection rod advantageously provides better power handling via gas flow for cooling the connecting rods, removes the possibility of arcing by removing sharp edges, and provides a compact design with efficient use of space. The coaxial connecting arrangement of the hollow rods advantageously allows for accommodating axial variations due to assembly tolerances.

FIG. 1 depicts a schematic view of a process chamber 100 in accordance with at least some embodiments of the present disclosure. In some embodiments, the process chamber 100 is a plasma processing chamber, such as an etch processing chamber. However, other types of process chambers configured for different processes can also use or be modified for use with embodiments of the RF power connection rods described herein.

In some embodiments, the process chamber 100 is a vacuum chamber which is suitably adapted to maintain sub-atmospheric pressures within a chamber interior volume 120 during substrate processing. The process chamber 100 includes a chamber body 106 covered by a lid 104 which encloses a processing volume 119 located in an upper half of chamber interior volume 120. The process chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate 122, such as a semiconductor wafer, for example, or other such substrate as may be retained via an electrostatic chuck or vacuum chucking. For example, the substrate support 124 may generally comprise a pedestal 150 and a hollow support shaft 112 for supporting the pedestal 150. The pedestal 150 may comprise an electrostatic chuck 152 having one or more electrodes 154 disposed therein and a cooling plate 136. The hollow support shaft 112 provides a conduit to provide, for example, backside gases, process gases, fluids, coolants, power, or the like, to the pedestal 150. The substrate support 124 may include a ceramic ring 187 disposed about the electrostatic chuck 152.

In some embodiments, the hollow support shaft 112 is coupled to a lift mechanism 113, such as an actuator or motor, which provides vertical movement of the electrostatic chuck 152 between an upper, processing position (as shown in FIG. 1) and a lower, transfer position (not shown). A bellows assembly 110 is disposed about the hollow support shaft 112 and is coupled between the pedestal 150 and a bottom surface 126 of the process chamber 100 to provide a flexible seal that allows vertical motion of the pedestal 150 while preventing loss of vacuum from within the process chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a backside gas supply 141, a chucking power supply 140, and RF sources (e.g., RF plasma power supply 170 and a bias power supply 117) to the pedestal 150. In some embodiments, the bias power supply 117 includes one or more RF bias power sources. In some embodiments, RF energy supplied by the RF plasma power supply 170 may have a frequency of about 13 MHz or greater. The backside gas supply 141 is disposed outside of the chamber body 106 and supplies heat transfer gas to the electrostatic chuck 152. In some embodiments, a RF plasma power supply 170 and a bias power supply 117 are coupled to the pedestal 150 via respective RF match networks (only RF match network 116 shown). In some embodiments, the substrate support 124 may alternatively include AC, DC, or RF bias power.

An RF power connection rod 184 may be used to couple RF power between any components of the process chamber 100. For example, the RF match network 116 is coupled to the RF power connection rod 184 to supply high power, for example, 1 kW or greater, to the process chamber 100. In some embodiments, the RF match network 116 may be coupled to an output sensor 182 to supply RF power to the process chamber 100 via the RF power connection rod 184.

In some embodiments, the bias power supply 117, the RF match network 116, the output sensor 182, and the RF power connection rod 184 may be disposed in an enclosure 158. In some embodiments, the bias power supply 117 is outside of the enclosure 158. In some embodiments, the RF match network 116 is inside of the enclosure 158 and the RF power connection rod 184 and the output sensor 182 are coupled to but disposed outside of the enclosure 158. In some embodiments, the RF power connection rod 184 may be used to deliver RF power to the RF plasma power supply 170.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 152. The electrostatic chuck 152 may include through holes to receive the lift pins 109. In some embodiments, the ceramic ring 187 may include through holes to receive the lift pins 109. A bellows assembly 131 is coupled between the substrate lift 130 and bottom surface 126 to provide a flexible seal which maintains the chamber vacuum during vertical motion of the substrate lift 130.

In some embodiments, the electrostatic chuck 152 includes gas distribution channels 138 extending from a lower surface of the electrostatic chuck 152 (e.g., bottom surface of the cooling plate 136) to various openings in an upper surface of the electrostatic chuck 152. The gas distribution channels 138 are configured to provide backside gas, such as nitrogen (N) or helium (He), to the top surface of the electrostatic chuck 152 to act as a heat transfer medium. The gas distribution channels 138 are in fluid communication with the backside gas supply 141 via gas conduit 142 to control the temperature and/or temperature profile of the electrostatic chuck 152 during use.

The process chamber 100 is coupled to and in fluid communication with a vacuum system 114 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 is also coupled to and in fluid communication with a process gas supply 118 which may supply one or more process gases to the process chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes near or within the chamber interior volume 120 to ignite the process gas and creating the plasma 102. A bias power is provided from a bias power supply (e.g., bias power supply 117) to the pedestal 150 to attract ions from the plasma towards the substrate 122.

Figure 2:
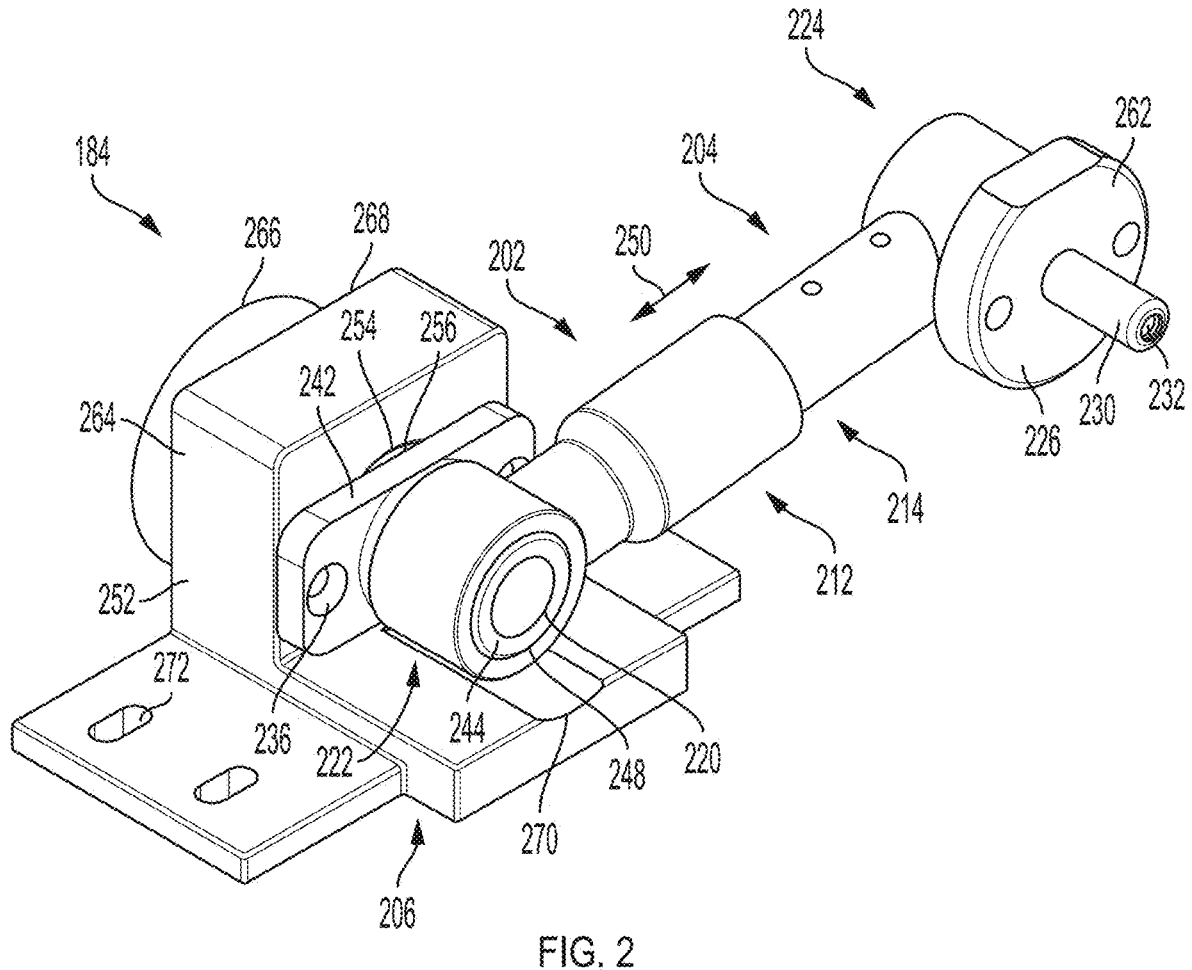
FIG. 2 depicts an isometric view of an RF power connection rod in accordance with at least some embodiments of the present disclosure.
Figure 3:
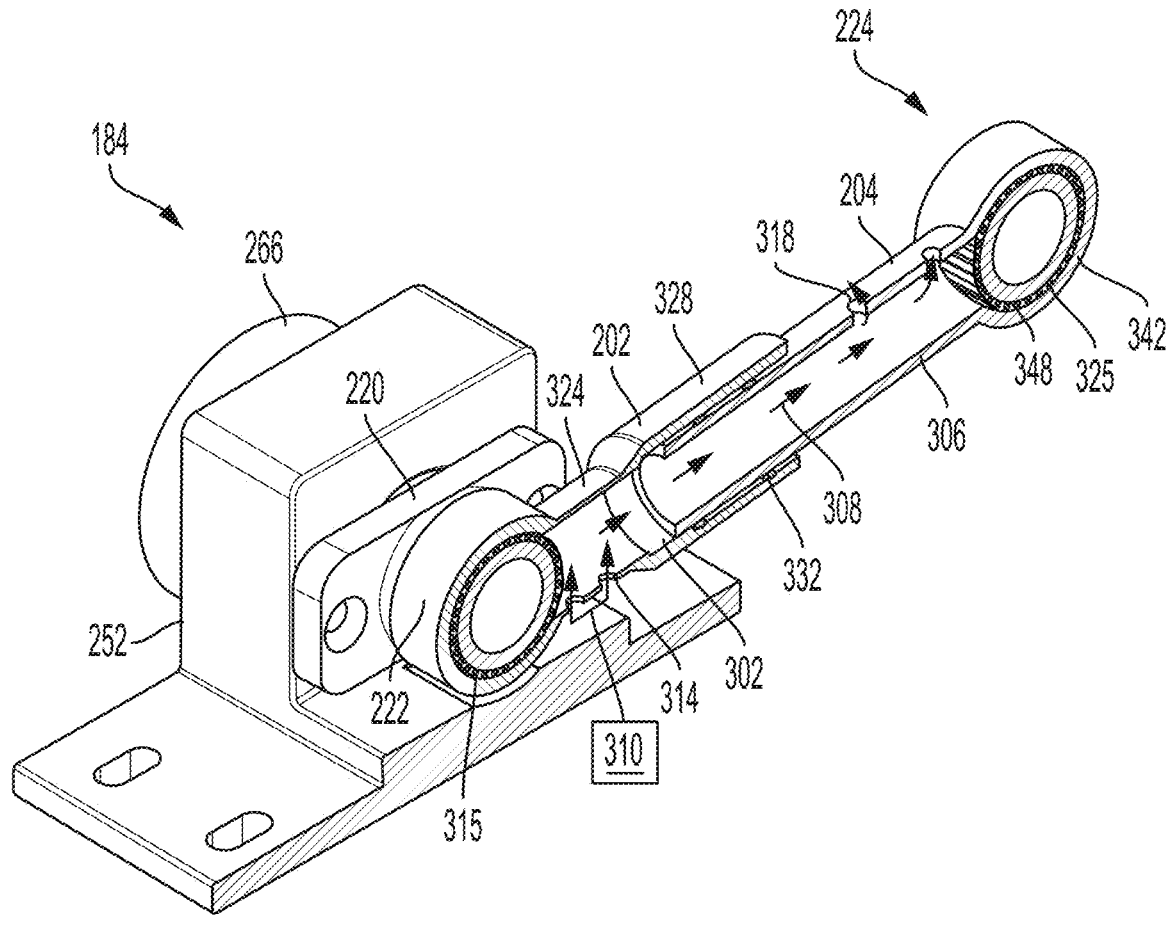
FIG. 3 depicts a schematic cross-sectional isometric view of an RF power connection rod in accordance with at least some embodiments of the present disclosure.

FIG. 2 depicts an isometric view of an RF power connection rod 184 in accordance with at least some embodiments of the present disclosure. FIG. 3 depicts a schematic cross-sectional isometric view of the RF power connection rod 184 in accordance with at least some embodiments of the present disclosure. The RF power connection rod 184 generally includes a first connection rod 202 coupled to a second connection rod 204. The first connection rod 202 has a first connection end 212 and a first socket end 222 opposite the first connection end 212. In some embodiments, the first connection rod 202 includes a first hollow portion 302 extending from the first connection end 212 to the first socket end 222. In some embodiments, the first hollow portion 302 includes a first part 324 and a second part 328. In some embodiments, the first part 324 is disposed between the second part 328 and the first socket end 222. In some embodiments, the second part 328 has an outer diameter greater than an outer diameter of the first part 324. The first connection rod 202 is made of a conductive material, such as copper or brass.

The second connection rod 204 has a second connection end 214 and a second socket end 224 opposite the second connection end 214. In some embodiments, the second connection rod 204 includes a second hollow portion 306 extending from the second connection end 214 to the second socket end 224. The second connection end 214 is adjustably coupled to the first connection end 212 along an axial direction 250 of the second connection rod 204, allowing for linear adjustment. The linear adjustment may be used to compensate for any tolerance issues during assembly. In some embodiments, the second connection end 214 is disposed in the first hollow portion 302 to couple the first connection rod 202 to the second connection rod 204. In some embodiments, the outer diameter of the first part 324 is substantially the same as an outer diameter of the second connection rod 204. The second connection rod 204 is made of a conductive material, such as copper or brass.

In some embodiments, a conductive member 332 is disposed between the first connection rod 202 and the second connection rod 204 to facilitate coupling the first connection rod 202 to the second connection rod 204. In some embodiments, the conductive member 332 is ring shaped. The conductive member 332 may advantageously maintain good electrical connection between the first connection rod 202 and the second connection rod 204. In some embodiments, the conductive member 332 is a biasable conductive member providing a constant spring pressure between the first connection rod 202 and the second connection rod 204 to maintain good electrical connection. In some embodiments, the biasable conductive member includes a plurality of contact surfaces with a plurality of louvers disposed therebetween.

The enclosure 158 may include many process chamber components in close proximity. Sharp corners or edges of power connectors may lead to unwanted arcing. Therefore, the first connection rod 202 and the second connection rod 204 generally comprise rounded features and minimal sharp edges to advantageously reduce or prevent arcing between the RF power connection rod 184 and other process chamber components. The rounded features also advantageously allow for process chamber components to be arranged more closely to the RF power connection rod 184 due to the reduced propensity for arcing, thereby reducing a footprint of the enclosure 158.

The RF power connection rod 184 may heat up due to the high power delivered therethrough. The RF power connection rod 184 may advantageously include a gas flow path 308 for cooling during use and to facilitate delivery of high RF power to the process chamber. In some embodiments, the first connection rod 202 and the second connection rod 204 define a gas flow path 308 therethrough. In some embodiments, the gas flow path 308 extends from one or more gas inlets 314 of the first connection rod 202, through the first hollow portion 302 to the second hollow portion 306, to one or more gas outlets 318 disposed through the second connection rod 204. In some embodiments, the one or more gas inlets 314 consist of two inlets. In some embodiments, the one or more gas outlets 318 consist of two outlets. A gas supply 310 may be coupled to the one or more gas inlets 314 to provide cooling gas. The cooling gas may be air, inert gas, or the like.

A first plug 220 is coupled to the first socket end 222. In some embodiments, the first plug 220 includes a first plate 242 and a first tube 244 extending from the first plate 242. In some embodiments, the first socket end 222 includes an opening 248 extending therethrough for the first plug 220. For example, in some embodiments, the first plug 220 is rotatably coupled to the first socket end 222 via the first tube 244 extending through the opening 248 and rotatable within the opening 248. In some embodiments, one or more first retainer rings 315 are disposed between the first plug 220 and the first socket end 222 to hold the assembly of the first plug 220 and the first socket end 222 together.

A second plug 226 is coupled to the second socket end 224. In some embodiments, the second plug 226 is rotatably coupled to the second socket end 224 via a second opening 342 in the second socket end 224. In some embodiments, the second plug 226 includes a second plate 262 and a second tube 348 extending from the second plate 262. In some embodiments, the second tube 348 extends into the second opening 342. In some embodiments, one or more second retainer rings 325 are disposed between the second tube 348 and the second socket end 224 to hold the assembly of the second plug 226 and the second socket end 224 together. In some embodiments, the one or more first retainer rings 315 and the one or more second retainer rings 325 are made of stainless steel.

In some embodiments, the second plate 262 includes one or more holes for fastening the RF power connection rod 184 to the output sensor 182. In some embodiments, the second plate 262 includes a post 232 extending from a side of the second plate 262 opposite the second tube 348. In some embodiments, a vented screw 230 extends through the post 232 to facilitate gas flow passing through the second socket end 224 to cool the second socket end 224 and the output sensor 182 that is connected to the second socket end 224.

In some embodiments, a housing 252 is coupled to the first socket end 222. The housing 252 is made of an insulator and is configured to facilitate coupling the RF power connection rod 184 to the process chamber 100, for example, to the enclosure 158, the chamber body 106, or other chamber component(s). In some embodiments, the housing 252 is made of a plastic material. In some embodiments, the housing 252 includes a bottom plate 206 and a wall 264 extending from the bottom plate 206. The first plate 242 of the first plug 220 may include openings 236 for fastening the first plug 220 to the housing 252. The housing 252 may include openings 272 for fastening the housing 252 to a chamber component. In some embodiments, the openings 272 are disposed in the bottom plate 206.

In some embodiments, the first plug 220 includes a third tube 256 extending from the first plate 242 on a side of the first plate 242 opposite the first tube 244. In some embodiments, the third tube 256 extends through an opening 254 through the wall 264 of the housing 252. In some embodiments, the housing 252 includes an access tube 266 extending from a rear surface 268 of the wall 264 to provide access to the first plug 220 for electrical coupling. In some embodiments, the bottom plate 206 of the housing 252 includes a groove 270 corresponding with the shape of the first socket end 222 for facilitating rotational movement of the first socket end 222 with respect to the housing 252.

While the foregoing is directed to embodiments of the present disclosure, other and further embodiments of the disclosure may be devised without departing from the basic scope thereof.

The invention claimed is:

1. A radio frequency (RF) power connection rod, comprising:
   a first connection rod having a first connection end, a first socket end opposite the first connection end, and a first hollow portion extending from the first connection end to the first socket end, wherein the first socket end is a closed end and comprises a cylindrical shaped body having a central axis extending orthogonal to a central axis of a cylindrical shaped body of the first connection end;
   a second connection rod having a second connection end, a second socket end opposite the second connection end, and a second hollow portion extending from the second connection end to the second socket end, wherein the second connection end is adjustably coupled to the first connection end along an axial direction of the second connection rod, wherein the second socket end is a closed end, and wherein a gas flow path extends from one or more gas inlets of the first connection rod, through the first hollow portion to the second hollow portion, to one or more gas outlets disposed through the second connection rod;
   a first plug coupled to the first socket end via an opening through the cylindrical shaped body along the central axis of the first socket end; and
   a second plug coupled to the second socket end via an opening through the second socket end extending along an axis orthogonal to the axial direction of the second connection rod.

2. The RF power connection rod of claim 1, wherein the second connection end comprises a tubular body disposed in the first hollow portion to couple the first connection rod to the second connection rod via the tubular body.

3. The RF power connection rod of claim 2, further comprising a conductive member disposed between a radially inner surface of the first connection rod and a radially outer surface of the second connection rod to facilitate coupling the first connection rod to the second connection rod.

4. The RF power connection rod of claim 2, wherein the first hollow portion includes a first part and a second part, wherein the first part is disposed between the second part and the first socket end, and wherein the second part has an outer diameter greater than an outer diameter of the first part.

5. The RF power connection rod of claim 1, further comprising a housing coupled to the first socket end, the housing made of an insulator and configured to facilitate coupling the RF power connection rod to a process chamber, wherein the first socket end is rotatably coupled to the housing.

6. The RF power connection rod of claim 1, further comprising a housing coupled to the first socket end via the first plug, wherein the housing includes a bottom plate and a wall extending from the bottom plate.

7. The RF power connection rod of claim 1, wherein the first connection end comprises a first hollow tube and the second connection end comprises a second hollow tube, wherein the gas flow path extends along an inner surface of the second hollow tube.

8. The RF power connection rod of claim 1, wherein the first connection rod and the second connection rod are made of copper or brass.

9. The RF power connection rod of claim 1, further comprising one or more first retainer rings disposed between the first plug and the first socket end and one or more second retainer rings disposed between the second plug and the second socket end, wherein the one or more first retainer rings have a line of sight to the one or more second retainer rings.

10. A radio frequency (RF) power connection rod for use with a process chamber, comprising:
   a first connection rod having a first connection end, a first socket end opposite the first connection end, and a first hollow portion extending from the first connection end to the first socket end, wherein an inner diameter of the first hollow portion is larger than a wall thickness of the first hollow portion throughout the first hollow portion;
   a second connection rod having a second connection end, a second socket end opposite the second connection end, and a second hollow portion extending from the second connection end to the second socket end, wherein the second connection end is adjustably coupled to the first connection end along an axial direction of the second connection rod, and wherein an inner diameter of the first connection end is substantially constant and an outer diameter of the second connection end is substantially constant;
   a first plug rotatably coupled to the first socket end about an axis orthogonal to the axial direction of the second connection rod via an opening in the first socket end; and
   a second plug rotatably coupled to the second socket end about an axis orthogonal to the axial direction of the second connection rod via a second opening in the second socket end.

11. The RF power connection rod of claim 10, wherein a gas flow path extends from one or more gas inlets of the first connection rod, through the first hollow portion to the second hollow portion, to one or more gas outlets disposed through the second connection rod.

12. The RF power connection rod of claim 10, wherein the second connection end extends into the first hollow portion.

13. The RF power connection rod of claim 10, wherein the second plug includes a second plate and a second tube extending from the second plate.

14. The RF power connection rod of claim 10, wherein a first end of the first plug extends through the first socket end and a second end of the first plug is coupled to a housing configured to facilitate coupling the RF power connection rod to a process chamber.

15. The RF power connection rod of claim 10, further comprising:
   one or more first retainer rings disposed between the first plug and the first socket end;
   one or more second retainer rings disposed between the second plug and the second socket end; and
   a biasable conductive member disposed between the first connection rod and the second connection rod to facilitate coupling the first connection rod to the second connection rod.

16. A process chamber, comprising:
   a chamber body having an interior volume therein;
   a substrate support disposed in the interior volume;
   an RF power supply coupled to the chamber body; and
   an RF power connection rod coupled to the RF power supply to provide RF power to the substrate support, the RF power connection rod, comprising:
      a first connection rod having a first connection end, a first socket end opposite the first connection end, and a first hollow portion extending from the first con-
nection end to the first socket end;

a second connection rod having a second connection
end, a second socket end opposite the second con-
nection end, and a second hollow portion extending
from the second connection end to the second socket
end, wherein the second connection end is adjustably
coupled to the first connection end along an axial
direction of the second connection rod, and wherein
a gas flow path extends from one or more gas inlets
of the first connection rod, through the first hollow
portion to the second hollow portion, to one or more
gas outlets disposed through the second connection
rod;

a first plug rotatably coupled to the first socket end via
an opening through the first socket end, wherein a
central axis of the opening extends along an axis
orthogonal to the axial direction of the second con-
nection rod;

a second plug rotatably coupled to the second socket
end via an opening through the second socket end,
wherein a central axis of the opening extends along
an axis orthogonal to the axial direction of the
second connection rod; and a housing coupled to the first socket end via the first
plug, wherein the housing includes a bottom plate
and a wall extending from the bottom plate.

17. The process chamber of claim 16, wherein the RF
power connection rod is coupled to the RF power supply via
an RF match.

18. The process chamber of claim 16, wherein the second
connection end is disposed in the first hollow portion to
couple the first connection rod to the second connection rod.

19. The process chamber of claim 16, wherein the RF
power connection rod is disposed in an enclosure.

20. The process chamber of claim 16, further comprising
an output sensor coupled to the second connection rod.

* * * * *